(12) United States Patent
Kondo et al.

(10) Patent No.: US 12,422,745 B2
(45) Date of Patent: Sep. 23, 2025

(54) IMPRINT DEVICE AND IMPRINT METHOD

(71) Applicants: SCIVAX CORPORATION, Kanagawa (JP); SHIN-ETSU CHEMICAL CO., LTD., Tokyo (JP)

(72) Inventors: Yukiko Kondo, Kawasaki (JP); Satoru Tanaka, Kawasaki (JP)

(73) Assignees: SCIVAX CORPORATION, Kanagawa (JP); SHIN-ETSU CHEMICAL CO., LTD., Tokyo (JP)

( * ) Notice: Subject to any disclaimer, the term of this patent is extended or adjusted under 35 U.S.C. 154(b) by 466 days.

(21) Appl. No.: 17/849,575

(22) Filed: Jun. 24, 2022

(65) Prior Publication Data

US 2022/0317568 A1    Oct. 6, 2022

Related U.S. Application Data

(63) Continuation-in-part of application No. PCT/JP2020/047648, filed on Dec. 21, 2020.

(30) Foreign Application Priority Data

Dec. 25, 2019 (JP) ................................. 2019-234816

(51) Int. Cl.
   G03F 7/00 (2006.01)
   B29C 59/02 (2006.01)
   H01L 21/67 (2006.01)

(52) U.S. Cl.
   CPC ............ *G03F 7/0002* (2013.01); *B29C 59/02* (2013.01); *G03F 7/0015* (2013.01); *H01L 21/67144* (2013.01)

(58) Field of Classification Search
   CPC ...................................................... G03F 7/0002
   See application file for complete search history.

(56) References Cited

U.S. PATENT DOCUMENTS

| | | | |
|---|---|---|---|
| 5,937,758 A | 8/1999 | Maracas et al. | |
| 5,947,027 A | 9/1999 | Burgin et al. | |
| 6,482,742 B1 | 11/2002 | Chou | |
| 7,137,803 B2* | 11/2006 | Chou | B29C 43/021 |
| | | | 425/389 |
| 8,158,048 B2* | 4/2012 | Ohashi | B82Y 10/00 |
| | | | 264/293 |
| 8,728,377 B2* | 5/2014 | Jang | B82Y 40/00 |
| | | | 264/319 |
| 8,973,495 B2* | 3/2015 | Kasumi | B82Y 10/00 |
| | | | 101/4 |
| 9,341,944 B2* | 5/2016 | Kolesnychenko | G03F 7/0002 |

(Continued)

FOREIGN PATENT DOCUMENTS

| | | |
|---|---|---|
| JP | 2004-504718 A | 2/2004 |
| JP | 2008-246944 A | 10/2008 |

(Continued)

OTHER PUBLICATIONS

Extended European Search Report dated May 7, 2024, issued in corresponding European Patent Application No. 20906694.3.

(Continued)

*Primary Examiner* — Atul P. Khare
(74) *Attorney, Agent, or Firm* — Morgan, Lewis & Bockius LLP (57) ABSTRACT

The present disclosure provides an imprinting device and an imprinting method. The present disclosure also provides a stamp comprising a resin-made molding component.

23 Claims, 4 Drawing Sheets

(56) References Cited

U.S. PATENT DOCUMENTS

| | | |
|---|---|---|
| 2002/0132482 A1 | 9/2002 | Chou |
| 2007/0262049 A1* | 11/2007 | Miyajima ............. B29C 43/021 |
| | | 425/174 |
| 2008/0237931 A1 | 10/2008 | Ohashi et al. |
| 2009/0273119 A1 | 11/2009 | Imai |
| 2014/0319718 A1 | 10/2014 | Kawaguchi et al. |
| 2015/0069672 A1 | 3/2015 | Zhang et al. |
| 2016/0147143 A1 | 5/2016 | Ito et al. |
| 2016/0349634 A1 | 12/2016 | Tanaka et al. |
| 2016/0351409 A1 | 12/2016 | Takahata et al. |
| 2018/0364565 A1 | 12/2018 | Baba |
| 2021/0318473 A1* | 10/2021 | Yaegashi ............. B29C 37/0067 |

FOREIGN PATENT DOCUMENTS

| | | | | |
|---|---|---|---|---|
| JP | 2011-199136 A | 10/2011 | | |
| JP | 2014-175620 A | 9/2014 | | |
| JP | 2016-219679 A | 12/2016 | | |
| JP | 2016-225433 A | 12/2016 | | |
| JP | 2017-135221 A | 8/2017 | | |
| JP | 2019-212862 A | 12/2019 | | |
| KR | 100913497 B1 * | 8/2009 | ........... | G03F 7/0002 |
| KR | 101780487 B1 * | 9/2017 | ........... | G03F 7/0002 |
| WO | 2007/105474 A1 | 9/2007 | | |
| WO | WO-2012165310 A1 * | 12/2012 | ........... | B29C 59/022 |

OTHER PUBLICATIONS

Office Action dated Aug. 13, 2024, issued in corresponding Singaporean Patent Application No. 11202251896M.

International Search Report issued in related International Patent Application No. PCT/JP2020/047648 dated Mar. 2, 2021.

* cited by examiner

Prior Art

IMPRINT DEVICE AND IMPRINT METHOD

TECHNICAL FIELD

The present disclosure relates to an imprinting device and an imprinting method.

BACKGROUND ART

Conventionally, in the field of a Micro Electro Mechanical Systems (MEMS), in order to enhance a function or an additional value, a high-integration or a composite integration that integrates, on a substrate, micro-components which have the same or different kinds of function is adopted.

Although there are various schemes to carry out such a high-integration, for example, there is a scheme of transferring a micro-component using a stamp which is formed of an elastic material and which has a plurality of protrusions (see, for example, Patent Document 1). In this case, adhesion with the micro-component can be controlled by the pressure between the protrusions of the stamp and the micro-component and a speed at the time of picking up the micro-component.

Conversely, formation of such a stamp by imprinting is being examined. The imprinting is to depresses a mold that has a micropattern against an object subjected to pattern formation like a resin, and to transfer the pattern to the object subjected to pattern formation by utilizing light or heat (see, for example, Patent Document 2).

CITATION LIST

Patent Literatures

Patent Document 1: WO2008/088068A
Patent Document 2: WO2004/062886A

SUMMARY OF INVENTION

Technical Problem

Figure 8:
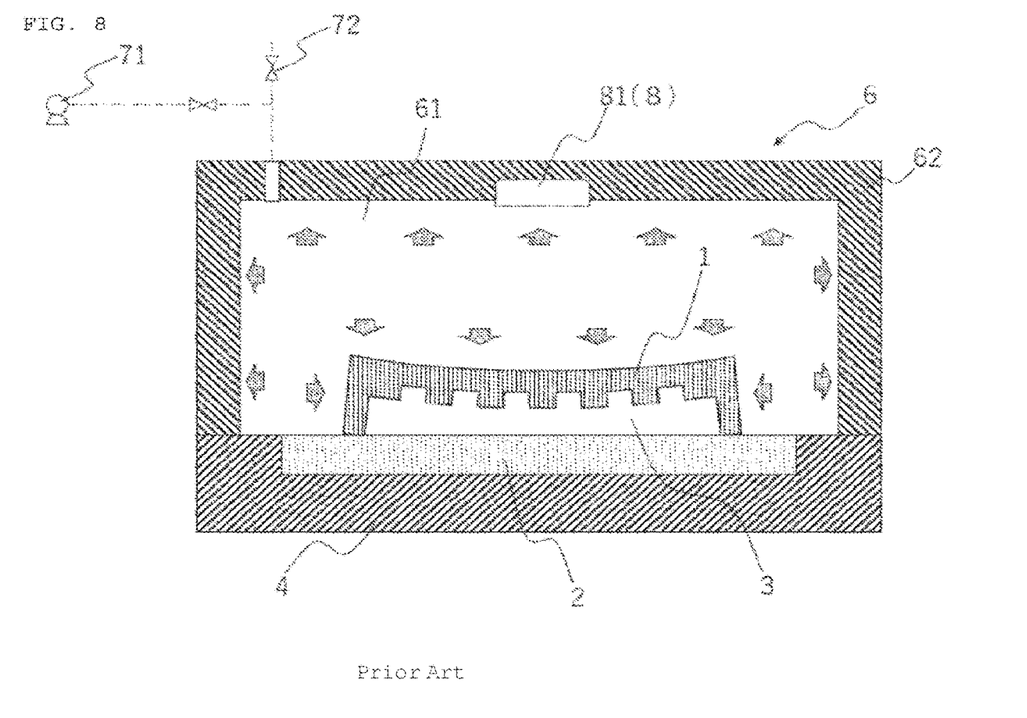
FIG. 8 is a cross-sectional view illustrating a conventional molding scheme.

According to conventional imprinting, however, when the mold is depressed, as illustrated in FIG. 8, there is a technical problem such that the center portion of the mold is warped. In this case, the respective positions of the tips of the protrusions of the formed stamp become different. This causes uneven pressure between the protrusions of the stamp and the micro-component at the time of picking up the micro-component, and thus there is a technical problem such that it is difficult to control adhesion with the micro-component.

Hence, an objective of the present disclosure is to provide an imprinting device and an imprinting method which can reduce the distortion of a transferred molding pattern.

Solution to Problem

In order to accomplish the above objective, an imprinting device according to a first aspect of the present disclosure pressurizes an object subjected to pattern formation by a mold and by a substrate to transfer a molding pattern of the mold to the object subjected to pattern formation, and includes:

a stage on which either one of the mold or the substrate is mounted;

placing means for placing either one of the mold or the substrate not mounted on the stage at a position where the mold and the substrate hold therebetween the object subjected to pattern formation, and also the position at which the mold and the substrate are freely movable in a direction becoming close to each other;

a pressure adjusting unit that includes a pressure adjusting chamber in which the mold and the substrate are placed gas-tightly;

depressurizing means for depressurizing an interior of the pressure adjusting chamber;

pressurizing means for pressurizing the interior of the pressure adjusting chamber within a range that the mold and the substrate are freely movable in the direction becoming close to each other; and fixing means for fixing the object subjected to pattern formation to the molding pattern.

In this case, it is preferable to further include slide preventing means for preventing slide movement of the mold and of the substrate. Moreover, the placing means may be utilized as the slide preventing means. In this case, the placing means is formed so as to be movable to a position at which slide movement of the mold and of the substrate is prevented.

The placing means may include position detecting means for detecting a relative position of the mold to the substrate.

The above imprinting device may further include control means for controlling at least either one of the placing means or the pressure adjusting means based on detection information from the position detecting means.

It is preferable that the placing means should place the mold and the substrate so as to be in parallel with each other.

It is preferable that the mold should include a wall portion that surrounds a circumference of the molding pattern. In this case, it is preferable that a height of the wall portion relative to a surface where the molding pattern is formed should be equal to or higher than 1 μm. Moreover, it is preferable that a difference between a maximum value of the height of the wall portion relative to a surface where the molding pattern is formed and a minimum value thereof should be equal to or smaller than 1 μm.

The fixing means may be light emitting means for emitting light to the object subjected to pattern formation for curing, or be temperature adjusting means for adjusting a temperature of the object subjected to pattern formation.

Moreover, an imprinting method according to a second aspect of the present disclosure is of pressuring an object subjected to pattern formation by a mold and by a substrate to transfer a molding pattern of the mold to the object subjected to pattern formation, and includes:

a depressurizing process of eliminating a gas between the mold and the object subjected to pattern formation;

a placing process of placing, in the depressurization, the mold and the substrate at, with the object subjected to pattern formation being held therebetween, a position at which the mold and the substrate are freely movable in a direction becoming close to each other;

a pressurizing process of pressurizing the mold and the object subjected to pattern formation by gas within a range that the mold and the substrate are freely movable in the direction becoming close to each other; and a fixing process of fixing the object subjected to pattern formation to the molding pattern.

It is preferable that the pressurizing process should be executed while slide movement of the mold and of the substrate is prevented.

It is preferable that the placing process should place the mold and the substrate so as to be in parallel with each other.

The fixing process may be a light emitting process of emitting light to the object subjected to pattern formation for curing, thereby fixing the molding pattern to the object subjected to pattern formation, or be a temperature adjusting process of adjusting a temperature of the object subjected to pattern formation for curing, thereby fixing the molding pattern to the object subjected to pattern formation.

In this case, it is preferable that the mold should include a wall portion that surrounds a circumference of the molding pattern. It is preferable that a height of the wall portion relative to a surface where the molding pattern is formed is equal to or higher than 1 μm. Moreover, it is preferable that a difference between a maximum value of the height of the wall portion relative to a surface where the molding pattern is formed and a minimum value thereof should be equal to or smaller than 1 μm.

Advantageous Effects of Invention

The imprinting device and the imprinting method according to the present disclosure can transfer a molding pattern without a distortion to an object subjected to pattern formation by uniformly pressurizing a mold.

DESCRIPTION OF EMBODIMENTS

Figure 1:
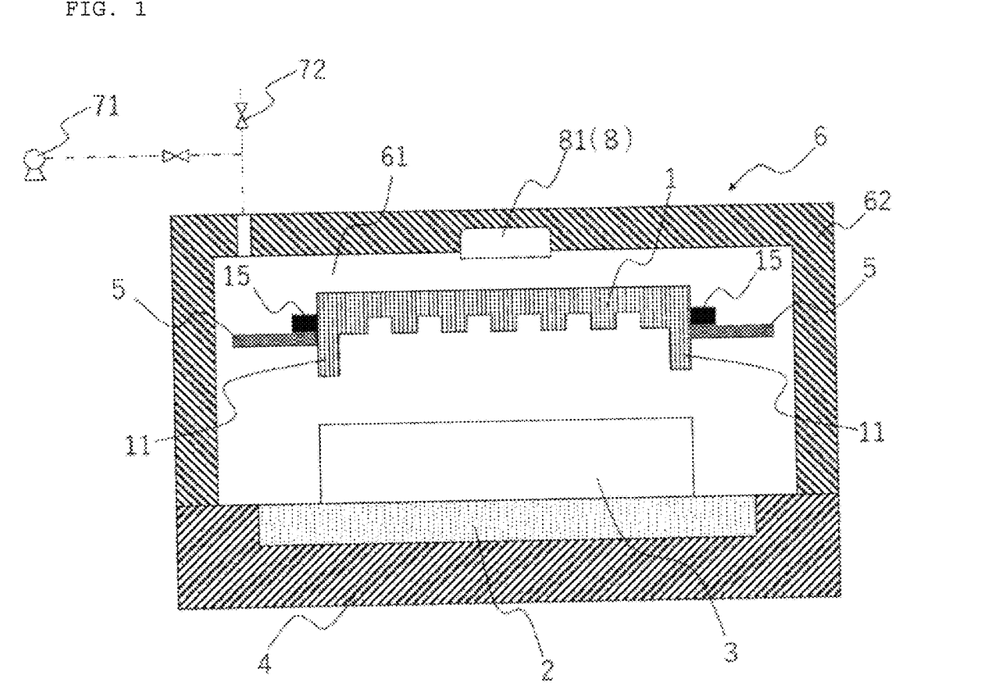
FIG. 1 is a cross-sectional view illustrating an imprinting device according to the present disclosure at the time of a depressurizing process.

An imprinting device according to the present disclosure will be described with reference to FIGS. 1 to 7. As illustrated in FIG. 1, the imprinting device according to the present disclosure is to pressurize an object 3 subjected to pattern formation with a mold 1 and a substrate 2 so as to transfer the molding pattern of the mold 1 to the object 3 subjected to pattern formation, and mainly includes a stage 4, placing means 5, a pressure adjusting unit 6, depressurizing means 71, pressurizing means 72, and fixing means 8.

Moreover, it is preferable that the mold 1 applied for the imprinting device and for an imprinting method according to the present disclosure should be formed of a rigid body so as to prevent the molding pattern from being distorted. For example, a resin, such as PET or COP, and an inorganic material like glass may be applied. In an optical imprinting process, when a light source is arranged at the mold-1 side, a transparent material is selected. Furthermore, when it is applied for thermal imprinting, a material that has a heat resistance relative to an applied temperature is selected.

The molding pattern includes, not only a geometric shape formed by concavities and convexities, but also, for example, a shape for transferring a predetermined surface condition like a transfer of a mirror-surface condition that has a predetermined surface roughness. Moreover, regarding the molding pattern, the minimum dimensions of the width of a convexity and of the width of a concavity are designed in various dimensions, such as equal to or smaller than 100 μm, equal to or smaller than 10 μm, equal to or smaller than 2 μm, equal to or smaller than 1 μm, equal to or smaller than 100 nm, and equal to or smaller than 10 nm. Moreover, the dimension in the depthwise direction is also designed*—in various dimensions, such as equal to or greater than 10 nm, equal to or greater than 100 nm, equal to or greater than 200 nm, equal to or greater than 500 nm, equal to or greater than 1 μm, equal to or greater than 10 μm, and equal to or greater than 100 μm.

Moreover, when a molding pattern with a high aspect is to be transferred, or when a base that supports the molding pattern is thick, there is a technical problem such that the object 3 subjected to pattern formation leaks out in the side-face direction of the mold 1, and the molding pressure for filling the object 3 subjected to pattern formation in the molding pattern becomes insufficient. Hence, the mold 1 may include a wall portion 11 that surrounds the circumference of the molding pattern. This suppresses the leakage of the object 3 subjected to pattern formation in the side-face direction of the mold 1 when the object 3 subjected to pattern formation is depressed by the mold 1, and the molding pattern can be sufficiently filled with the object 3 subjected to pattern formation. It is appropriate that the height of the wall portion 11 relative to the surface where the molding pattern is formed should be, for example, equal to or higher than 1 μm. Moreover, when the height of the wall portion is nonuniform, since the fluidity of the object subjected to pattern formation near the wall portion becomes different in a pressurizing process of the imprinting method to be described later, the parallelism between the mold and the substrate is unbalanced by pressurization. Hence, it is preferable that the nonuniformity of the height of the wall portion should be little. For example, it is preferable that the difference between the maximum value of the height of the wall portion relative to the surface where the molding pattern is formed and the minimum value thereof should be equal to or smaller than 1 μm.

The substrate 2 is not limited to any particular one as far as it can support the object 3 subjected to pattern formation, and for example, a resin, an inorganic compound, or a metal can be applied.

The object 3 subjected to pattern formation is an object to which the molding pattern of the mold 1 is to be transferred, and may be held by at least either one of the mold 1 or the substrate 2. An example resin applied as the object 3 subjected to pattern formation is a photo-curable resin, a thermosetting resin, or a thermoplastic resin.

The photo-curable resin applied as the object 3 subjected to pattern formation is a resin with a fluidity which is cured by light with a certain wavelength, and any photo-curable resin is applicable as far as it is applicable for an optical imprinting technology. For example, silicone rubber like polydimethylsiloxane (PDMS), epoxide containing compounds, and unsaturated hydrocarbon-group containing compounds like vinyl group and allyl group, such as (metha) acrylic ester compound, vinyl ether compounds, and bisallyl-nadiimide, are applicable. In this case, a material to which an initiator with optical reactivity is added and which progresses a polymerization reaction by emitted light so as to form the molding pattern may be applied. An example appropriate radical initiator with optical reactivity applicable is acetophenone derivative, benzophenone derivative, benzoin ether derivative, or xanthone derivative. Moreover, a reactive monomer may be applied without a solvent, or may be dissolved in a solvent, and may be desolvated after being applied.

The thermosetting resin applied as the object 3 subjected to pattern formation is a resin with a fluidity which is cured when heated, and any thermosetting resin is applicable as far as it is applicable for a thermal imprinting technology. For example, silicone rubber like polydimethylsiloxane (PDMS), epoxy containing compounds, and unsaturated hydrocarbon-group containing compounds like vinyl group and allyl group, such as (metha)acrylic ester compounds, vinyl ether compounds, and bis-allyl nadiimide compounds are applicable. In this case, for the purpose of thermal polymerization, polymerization-reaction-group containing compounds may be solely applied, and in order to improve the thermosetting characteristic, an initiator with a thermal reactivity may be added. An example appropriate radical initiator with a thermal reactivity applicable is organic peroxide and azo compound, and an example radial initiator with an optical reactivity is acetophenone derivative, benzophenone derivative, benzoin ether derivative, or xanthone derivative. Moreover, the reactive monomer may be applied without a solvent, or may be dissolved in a solvent, and may be desolvated after being applied.

Furthermore, the thermoplastic resin applied as the object 3 subjected to pattern formation is a resin which has a fluidity when a temperature reaches the glass-transition temperature or the melting point, and which is cured when being cooled, and any thermoplastic resin is applicable as far as it is applicable for a thermal imprinting technology. For example, cyclic olefin-based resin, such as cyclic olefin ring-open polymer/hydrogenated material (COP) or cyclic olefin copolymer (COC), acrylic resin, polycarbonate, vinyl ether resin, fluorine resin, such as perfluoroalkoxy alkane (PFA) or polytetrafluoroethylene (PTFE), polystyrene, polyimide-based resin, and polyester-based resin are applicable.

Figure 2:
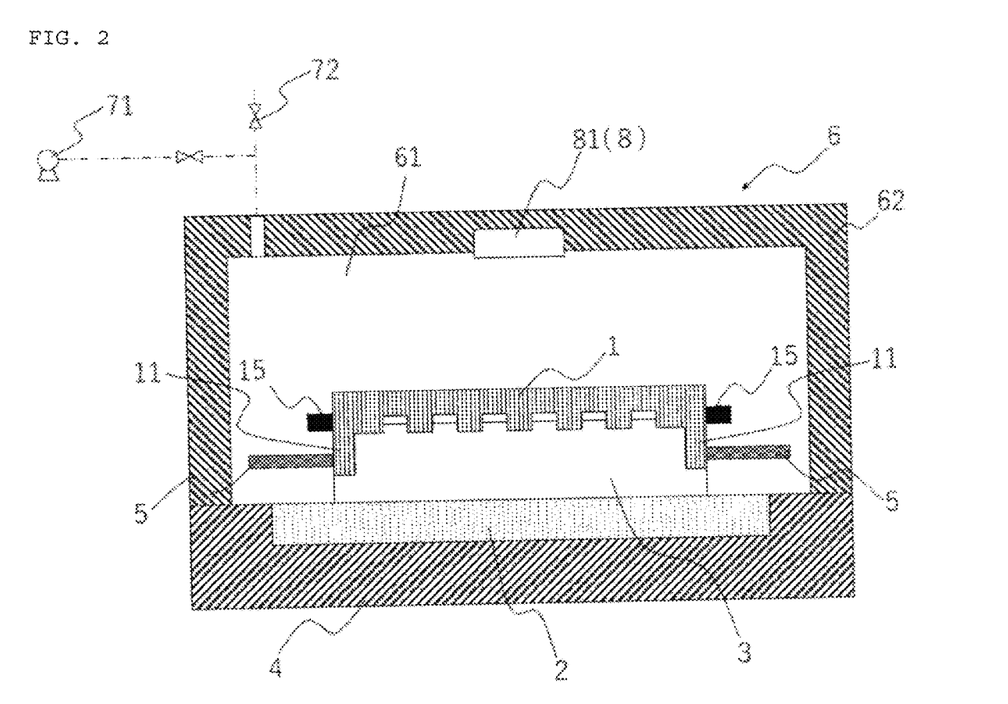
FIG. 2 is a cross-sectional view illustrating the imprinting device according to the present disclosure at the time of a placing process.
Figure 3:
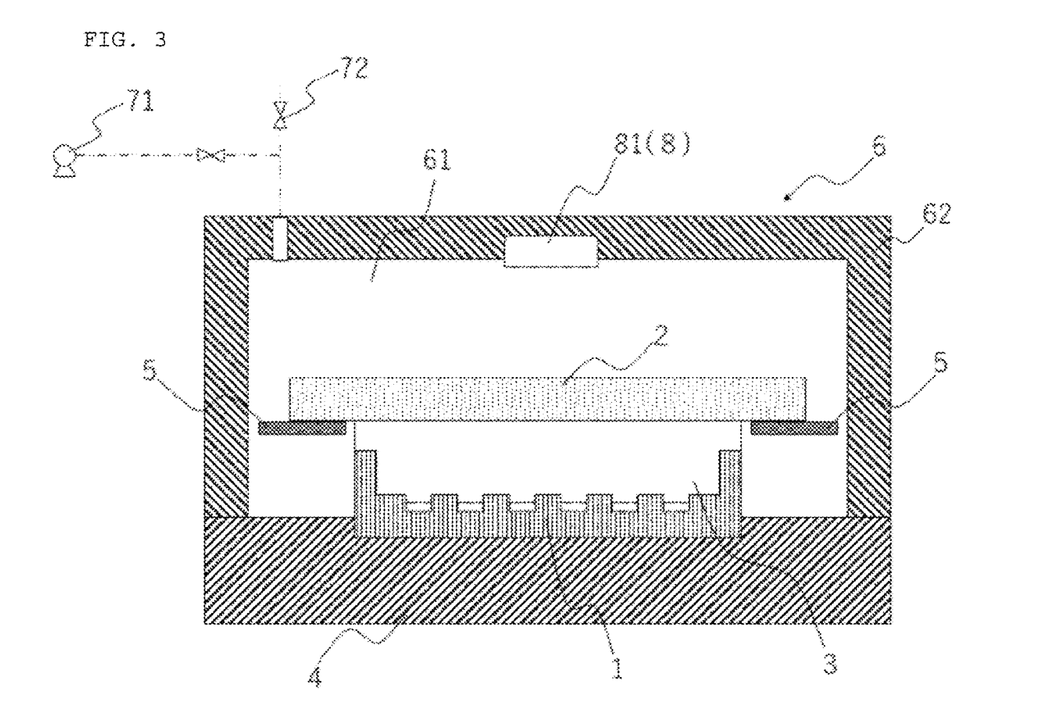
FIG. 3 is a cross-sectional view illustrating the imprinting device according to the present disclosure at the time of another placing process.

As illustrated in FIG. 2 or FIG. 3, the stage 4 is to mount either one of the mold 1 or the substrate 2. It is appropriate if the mold 1 and the substrate 2 are mounted so as to be in parallel with each other, and it is preferable that the surface of the mold 1 on which the molding pattern is formed and the opposing surface of the substrate 2 should be mounted so as to be horizontal to each other. The material of the stage 4 is not limited to any particular material as far as it can match the molding conditions, and for example, it is preferable to apply a material that has a pressure resistance, a heat resistance, etc., with respect to the molding conditions, and metal like stainless steel is applicable. Moreover, in an optical imprinting process, when a light source is placed at the stage-4 side, it is appropriate if a transparent material like glass is applied.

The placing means 5 is to place either one of the mold 1 or the substrate 2 that is not placed on the sage 4 at a position where the mold 1 and the substrate 2 hold therebetween the object 3 subjected to pattern formation and also the position at which the mold 1 and the substrate 2 are freely movable in the direction becoming close to each other. Note that, in this specification, the description that "the mold 1 and the substrate 2 hold therebetween the object 3 subjected to pattern formation" means a condition in which the object 3 subjected to pattern formation is in contact with both the mold 1 and the substrate 2. Moreover, in this specification, the description that "the mold 1 and the substrate 2 are freely movable in the direction becoming close to each other" means a condition in which the mold 1 or the substrate 2 is placed on the object 3 subjected to pattern formation with a fluidity so as to be substantially floating, and the entire mold 1 or substrate 2 can receive uniform pressure. More specifically, as illustrated in FIG. 2, when the substrate 2 is mounted on the stage 4, the mold 1 is placed at a position at which the mold 1 and the substrate 2 are freely movable in the direction becoming close to each other. That is, a state is achieved in which the mold 1 is placed on the object 3 subjected to pattern formation on the substrate 2 so as to be substantially floating. Moreover, as illustrated in FIG. 3, when the mold 1 is mounted on the stage 4, the substrate 2 is placed at a position at which the mold 1 and the substrate 2 are freely movable in the direction becoming close to each other. That is, a state is achieved in which the substrate 2 is placed on the object 3 subjected to pattern formation on the mold 1 so as to be substantially floating.

Furthermore, it is preferable that the placing means 5 should be able to place the mold 1 and the substrate 2 in parallel with each other. The placing means 5 is not limited to any particular one as far as it is located at a position where the mold 1 and the substrate 2 hold therebetween the object 3 subjected to pattern formation, and it can place either one of the mold 1 or the substrate 2 at a position at which the mold 1 and the substrate 2 are freely movable in the direction becoming close to each other, and for example, it may include a holding unit that holds the mold 1 or the substrate 2 horizontally, moving up-and-down means for moving up and down the holding unit, and separating means for separating the holding unit from the mold 1 in the horizontal direction. For example, protrusions 15 that protrude horizontally may be formed at respective side surfaces of the mold 1, and the holding unit may be formed in such a way that such protrusions 15 can be mounted. Although it is not illustrated in the figures, regarding the movement of the holding unit by the moving up-and-down means and by the separating means, conventional technologies can be applied such that it is moved by hydraulic or pneumatic cylinder, and moved by an electric motor and a ball screw, etc.

Moreover, the placing means 5 may include position detecting means to detect the relative position between the mold 1 and the substrate 2. Hence, the position where the mold 1 and the object 3 subjected to pattern formation or the substrate 2 and the object 3 subjected to pattern formation are in contact with each other, and also the position at which the mold 1 and the substrate 2 are freely movable in the direction becoming close to each other can be grasped. Furthermore, at the time of pressurizing, the mold 1 and the substrate 2 can be pressurized within a range that the mold 1 and the substrate 2 are freely movable in the direction becoming close to each other. Conventionally known technologies can be applied as the position detecting means, and for example, the position of the mold 1 may be measured using a laser length measuring machine provided at the stage 4. Moreover, when an electric motor is applied for the placing means 5, using an encoder provided in the electric motor, the position of the mold 1 may be measured by a calculation of the displacement amount.

Figure 4:
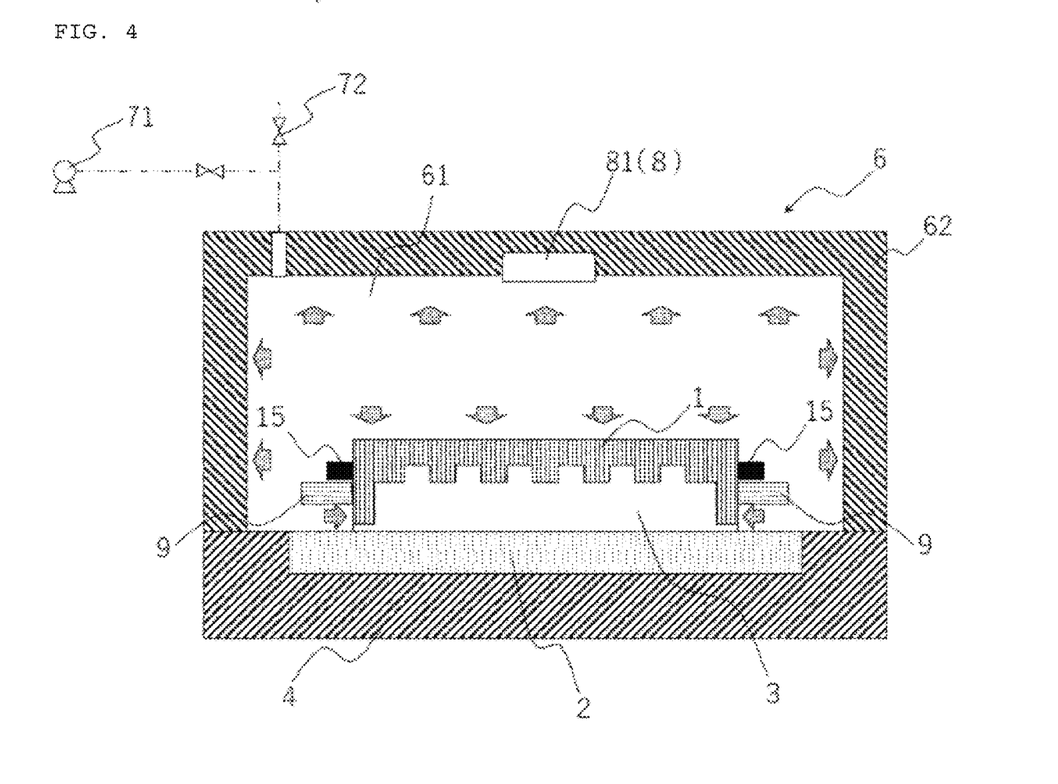
FIG. 4 is a cross-sectional view illustrating the imprinting device at the time of a pressurizing process.

The pressure adjusting unit 6 forms a pressure adjusting chamber 61 in which the mold 1 and the substrate 2 can be placed gas-tightly. Hence, by adjusting the pressure in the pressure adjusting chamber 61, a gas remaining in the molding pattern of the mold 1 can be suppressed, and it can pressurize the object 3 subjected to pattern formation by the mold 1 and the substrate 2. The pressure adjusting chamber 61 can have any size and any shape as far as it can place therein the mold 1 and the substrate 2 gas-tightly, and can be designed with the pressure in the pressure adjusting chamber 61 and the pressure adjusting time, etc., being taken into consideration. For example, as illustrated in FIG. 4, a cylindrical casing 62 with a bottom and forming the pressure adjusting chamber 61 together with the stage 4 can be applied. In this case, in order to carry the mold 1 and the substrate 2 in the pressure adjusting chamber 61, moving up-and-down means for moving the casing 62 up and down relative to the stage 4 may be provided so as to form a space between the casing 62 and the stage 4, or an opening and closing portion to carry the mold 1 and the substrate 2 in the pressure adjusting chamber 61 may be provided at the casing 62. Furthermore, the pressure adjusting unit 6 may be formed so as to have the pressure adjusting chamber 61 in which the stage 4 can be also placed gas-tightly.

The depressurizing means 71 is to eliminate a gas present between the mold 1 and the object 3 subjected to pattern formation, and to depressurize the interior of the pressure adjusting chamber 61 up to a pressure that does not cause a problem for pattern formation. The pressure which does not cause a problem for pattern formation means a pressure that can prevent a gas from remaining in the molding pattern as gas bubbles, and which can suppress the occurrence of a transfer failure. For example, such a pressure is equal to or smaller than 1000 Pa, and preferably, is equal to or smaller than 100 Pa. As for the depressurizing means 71, for example, a conventionally known depressurizing pump which is in communication with the interior of the pressure adjusting chamber 61, and which can eliminate the gas within the pressure adjusting chamber 61 may be applied.

Moreover, the pressurizing means 72 is to pressurize the interior of the pressure adjusting chamber 61 in order to fill the object 3 subjected to pattern formation in the molding pattern of the mold 1. The pressure which can fill the object 3 subjected to pattern formation in the molding pattern of the mold 1 is set in accordance with the viscosity, etc., of the object 3 subjected to pattern formation as appropriate. Moreover, the pressurizing means 72 pressurizes the interior of the pressure adjusting chamber 61 within a range that the mold 1 and the substrate 2 are freely movable in the direction becoming close to each other. Accordingly, since uniform pressure can be applied to the mold 1, the substrate 2, and the object 3 subjected to pattern formation, and thus an occurrence of a distortion on the object 3 subjected to pattern formation can be prevented. As for the pressurizing means 72, for example, a tank or a pressurizing pump which is in communication with the interior of the pressure adjusting chamber 61, and which supplies a gaseous body, such as air and inert gas that can pressurize the interior of the pressure adjusting chamber 61 may be applied. Moreover, when atmospheric pressure is sufficient as the pressurizing pressure, as illustrated in FIG. 4, a relief valve that connects the interior of the pressure adjusting chamber 61 and the exterior of the pressure adjusting chamber 61 may be applied.

Furthermore, control means that controls the placing means 5 and the pressure adjusting means 7 based on the detection information by the position detecting means may be provided. Accordingly, the placing means 5 is enabled to place the mold 1 or the substrate 2 at the position where the mold 1 and the substrate 2 hold therebetween the object 3 subjected to pattern formation, and also the position at which the mold 1 and the substrate 2 are freely movable in the direction becoming close to each other, and the pressurizing means 72 is enabled to pressurize the mold 1 and the object 3 subjected to pattern formation within the range that the mold 1 and the substrate 2 are freely movable in the direction becoming close to each other. The control means is not limited to any particular one as far as it can control the placing means 5 and the pressure adjusting method 7, and for example, a conventionally known computer may be applied.

The fixing means 8 is to fix the object 3 subjected to pattern formation to the molding pattern. As for the fixing means 8, in the case of optical imprinting, light emitting means 81 may be applied. Moreover, in the case of thermal imprinting, temperature adjusting means may be applied.

The light emitting means 81 is to emit light to the object 3 subjected to pattern formation which is formed of a photo-curable resin, and to cure it. The light emitting means 81 is not limited to any particular one as far as it can emit electromagnetic waves with a predetermined wavelength to the object 3 subjected to pattern formation for curing, and for example, an ultraviolet emitting device that emits ultraviolet to the object 3 subjected to pattern formation may be applied. In this case, as far as it can emit light to the object 3 subjected to pattern formation, the number of the light emitting means 8 may be a single number or a multiple number. When placing the multiple number of such means, it is preferable to place those in such a way that the lighting intensity distribution can be as uniform as possible across the object 3 subjected to pattern formation.

The temperature adjusting means is to adjust the temperature of the object 3 subjected to pattern formation which is formed of a thermosetting resin or a thermoplastic resin to allow the object 3 subjected to pattern formation to have a fluidity, or to cure. As for the temperature adjusting means, heating means that directly or indirectly heats the object 3 subjected to pattern formation may be applied. Moreover, cooling means that directly or indirectly cools the object 3 subjected to pattern formation may be also applied.

As far as it can heat either one of or both of the mold 1 and the object 3 subjected to pattern formation to a predetermined temperature, such as equal to or higher than the glass transition temperature or the melting point of the thermoplastic resin that forms the object 3 subjected to pattern formation, or equal to or higher than the curing temperature of the thermosetting resin, the heating means is not limited to any particular one. Moreover, it may heat the object 3 subjected to pattern formation from the stage-4 side or may heat from the mold-1 side. For example, a heater may be provided in the stage 4, and the mold 1 and the object 3 subjected to pattern formation may be heated. Moreover, heating may be performed using the heated liquid or gas.

As far as it can cool either one of or both of the mold 1 and the object 3 subjected to pattern formation to a predetermined temperature, such as lower than the glass transition temperature or the melting point of the thermoplastic resin that forms the object 3 subjected to pattern formation, or lower than the curing temperature of the thermosetting resin, the cooling means is not limited to any particular one. Moreover, it may cool the object 3 subjected to pattern formation from the stage-4 side or may cool from the mold-1 side. For example, a cooling fan, or a cooling fluid passage which is formed in the stage 4 and through which a fluid is caused to flow so as to cool the mold 1 and the object 3 subjected to pattern formation may be applied.

Moreover, the temperature adjusting means may include temperature detecting means that detects the temperatures of the mold 1, the substrate 2, the object 3 subjected to pattern formation, and the stage 4, etc., and may adjust the temperature of the object 3 subjected to pattern formation based on detected temperature information.

Figure 5:
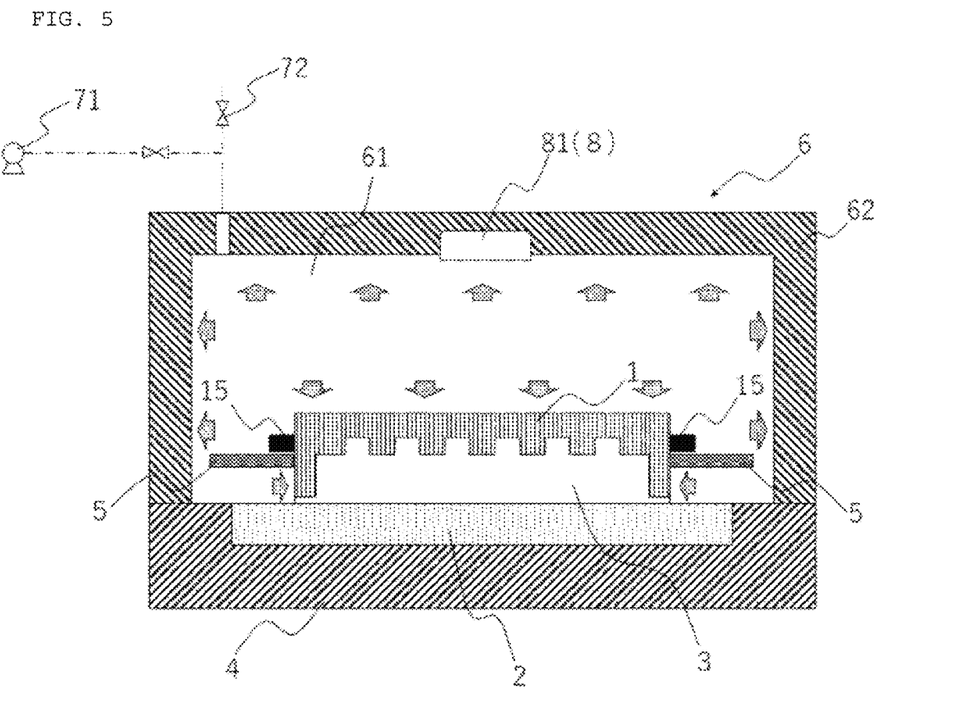
FIG. 5 is a cross-sectional view illustrating another imprinting device according to the present disclosure at the time of the pressurizing process.

Furthermore, according to the imprinting device of the present disclosure, since either one of the mold 1 or the substrate 2 is in a state floating on the object 3 subjected to pattern formation at the position at which the mold 1 and the substrate 2 are freely movable in the direction becoming close to each other, when the mold 1 and the substrate 2 are pressurized, the mold 1 and the substrate 2 are likely to make slide movement. Hence, slide preventing means 9 that prevents the mold 1 and the substrate 2 from making sliding movement may be provided. As far as it can prevent the sliding movement in the direction orthogonal to the becoming-close direction without disrupting the movement of the mold 1 or the substrate 2 floating on the object 3 subjected to pattern formation in such a becoming-close direction, the slide preventing means 9 is not limited to any particular one. For example, as illustrated in FIG. 4, the slide preventing means 9 like a guide placed with a predetermined clearance from the respective side faces of the mold 1 floating on the object 3 subjected to pattern formation may be provided. Moreover, when the component floating on the object 3 subjected to pattern formation is the substrate 2, although it is not illustrated in the figure, the slide preventing means like a guide placed with a predetermined clearance from the respective side faces of the substrate 2 may be provided. Furthermore, as illustrated in FIG. 5, the placing means 5 may be utilized as the slide preventing means. In this case, the placing means 5 may be formed so as to be movable at a position that prevents the sliding movement of the mold 1 and of the substrate 2 when the mold 1 and the object 3 subjected to pattern formation are pressurized. Note that the dimension of the clearance between the slide preventing means 9 and the side surface of the mold 1 or the substrate 2 is not limited to any particular dimension as far as it can permit the sliding movement of the mold 1 and of the substrate 2, but for example, may be smaller than 0.5 mm.

Next, an imprinting method according to the present disclosure will be described. The imprinting method according to the present disclosure pressurizes the object 3 subjected to pattern formation by the mold 1 and by the substrate 2 so as to transfer the molding pattern of the mold 1 to the object 3 subjected to pattern formation, and mainly includes a depressurizing process, a placing process, a pressurizing process, and a fixing process.

The depressurizing process is to eliminate a gas between the mold and the object subjected to pattern formation. As illustrated in FIG. 1, a clearance may be formed between the mold 1 and the object 3 subjected to pattern formation, and the interior of the pressure adjusting chamber 61 may be depressurized so as to eliminate the gas in the pressure adjusting chamber 61. This prevents the gas from remaining in the molding pattern as gas bubbles, thereby suppressing an occurrence of a transfer failure. The pressure at the depressurizing process is not limited to any particular pressure as far as the interior of the pressure adjusting chamber 61 can be depressurized to the pressure that does not cause a problem for pattern formation, but for example, may be equal to or lower than 1000 Pa, preferably, equal to or lower than 100 Pa.

As illustrated in FIG. 2 or FIG. 3, the placing process is to place, in depressurization, the mold 1 and the substrate 2 at a position at which the mold 1 and the substrate 2 are freely movable in the direction becoming close to each other with the object 3 subjected to pattern formation being held therebetween. More specifically, as illustrated in FIG. 2, when the substrate 2 is mounted on the stage 4, the mold 1 is placed at the position at which the mold 1 and the substrate 2 are freely movable in the direction becoming close to each other. That is, a state is achieved in which the mold 1 is placed on the object 3 subjected to pattern formation on the substrate 2 so as to be substantially floating. Moreover, as illustrated in FIG. 3, when the mold 1 is mounted on the stage 4, the substrate 2 is placed at the position at which the mold 1 and the substrate 2 are freely movable in the direction becoming close to each other. That is, a state is achieved in which the substrate 2 is placed on the object 3 subjected to pattern formation on the mold 1 so as to be substantially floating. Note that in the placing process, it is preferable that the mold 1 and the substrate 2 should be placed in parallel with each other.

As illustrated in FIG. 4, the pressurizing process is to pressurize the mold 1 and the object 3 subjected to pattern formation by gas within a range that the mold 1 and the substrate 2 are freely movable in the direction becoming close to each other. Accordingly, since uniform pressure can be applied to the mold 1, the substrate 2, and the object 3 subjected to pattern formation, a distortion of the object 3 subjected to pattern formation can be suppressed.

Note that as described above, in the pressurizing process, since either one of the mold 1 or the substrate 2 is in a state floating on the object 3 subjected to pattern formation at the position at which the mold 1 and the substrate 2 are freely movable in the direction becoming close to each other, the mold 1 and the substrate 2 are likely to make slide movement when the mold 1 and the substrate 2 are pressurized. Therefore, it is preferable that the pressurizing process should be carried out while the sliding movement of the mold 1 and of the substrate 2 is prevented (see FIG. 4 or FIG. 5).

Figure 6:
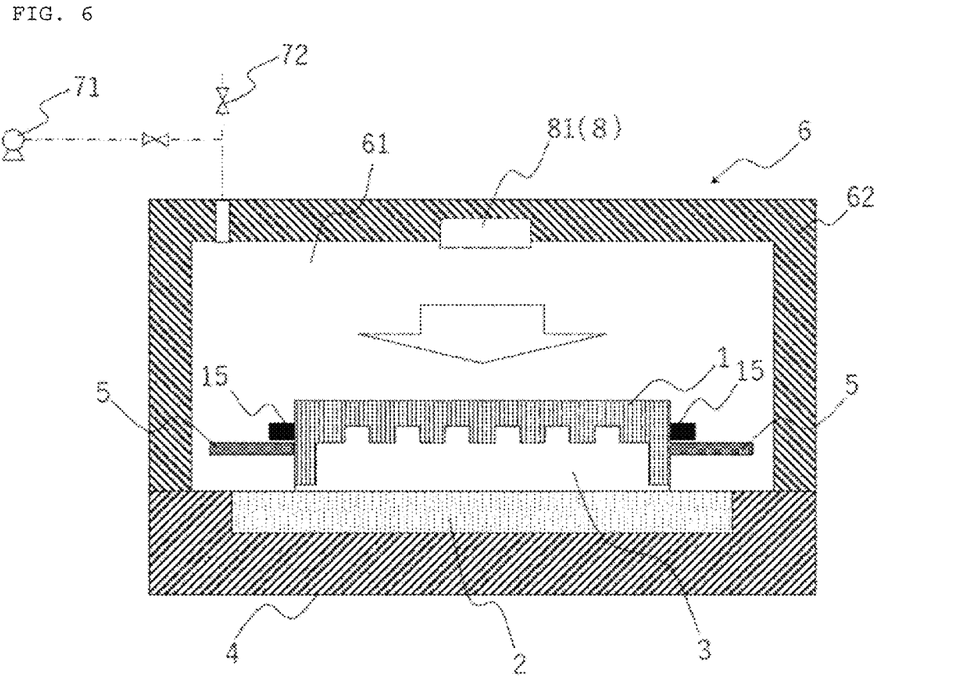
FIG. 6 is a cross-sectional view illustrating the imprinting device according to the present disclosure at the time of a fixing process.

The fixing process is to fix the object 3 subjected to pattern formation to the molding pattern. Regarding the fixing process, in the case of optical imprinting, as illustrated in FIG. 6, light may be emitted to the object 3 subjected to pattern formation that is formed of a photo-curable resin for curing, and the molding pattern may be fixed to the object 3 subjected to pattern formation. The light to be emitted is not limited to any particular light as far as it can cure the photo-curable resin applied as the object 3 subjected to pattern formation, and for example, ultraviolet can be applied. Moreover, in the case of thermal imprinting, the temperature of the object 3 subjected to pattern formation may be adjusted for curing, and the molding pattern may be fixed to the object 3 subjected to pattern formation. When, for example, the object 3 subjected to pattern formation is formed of a thermosetting resin, the object 3 subjected to pattern formation may be heated for curing beyond a temperature at which such a resin cures. Moreover, when the object 3 subjected to pattern formation is formed of a thermoplastic resin, the object 3 subjected to pattern formation may be cooled for curing at a temperature lower than the glass transition temperature or the melting point of such a resin.

Note that in the case of the thermal imprinting, a temperature adjusting process to adjust the temperature in such a way that the object 3 subjected to pattern formation has a flowability may be necessary prior to the pressurizing process. When, for example, the object 3 subjected to pattern formation is formed of a thermoplastic resin, the object 3 subjected to pattern formation is heated beyond the glass transition temperature or the melting point of such a resin. Moreover, when the object 3 subjected to pattern formation is formed of a thermosetting resin, the temperature of the object 3 subjected to pattern formation is maintained at a temperature equal to or lower than a temperature at which such a resin does not cure. Note that the temperature adjusting process may be carried out before or after the depressurizing process.

Figure 7:
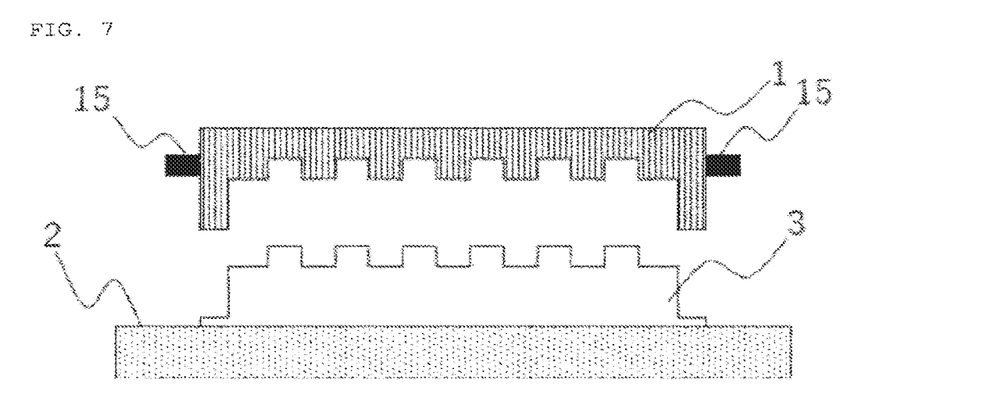
FIG. 7 is a cross-sectional view illustrating an object subjected to pattern formation according to the present disclosure after the pattern formation.

Eventually, as illustrated in FIG. 7, when the mold 1 is demolded from the object 3 subjected to pattern formation, the object 3 subjected to pattern formation to which the molding pattern of the mold 1 is transferred without a distortion can be formed.

Next, a stamp according to the present disclosure will be described. The stamp according to the present disclosure has a resin-made molding component formed on a substrate. The resin-made molding component includes a surface provided with a pattern, a side face extending from the surface provided with the pattern to the substrate, and a circumferential portion extending from the side face toward an external edge of the substrate.

The pattern includes convexities and concavities. The convexity is formed so as to control adhesion with a micro-component by pressure between the convexities of the stamp and the micro-component, and speed when the micro-component, such as a micro LED or a semiconductor chip, is picked up. The minimum dimension of the width of the convexity and that of the width of the concavity are formed in various sizes, such as equal to or smaller than 100 µm, equal to or smaller than 10 µm, equal to or smaller than 2 µm, equal to or smaller than 1 µm, equal to or smaller than 100 nm, and equal to or smaller than 10 nm. Moreover, the depth of the concavity is also formed in various sizes, such as equal to or greater than 10 nm, equal to or greater than 100 nm, equal to or greater than 200 nm, equal to or greater than 500 nm, equal to or greater than 1 µm, equal to or greater than 10 µm, and equal to or greater than 100 µm. Such a pattern can be produced by, for example, the above-described imprinting method according to the present disclosure. When produced by the imprinting method, the pattern is an inverted molding pattern of the mold 1.

In order to control the degree of flow of the object to be molded and suppress the variation in the height of the stamp, it is preferable that the height of the circumferential portion should be equal to or lower than 20% of the height of the stamp, more preferably, equal to or lower than 10%, and particularly preferably, equal to or lower than 5%. It is preferable that the lower limit should be substantially 0.1% of the height of the stamp.

It is preferable that the circumferential portion should be continuous along the circumferential direction of the stamp. It is preferable that the continuous length should be equal to or greater than 10% of the length of the whole circumference of the stamp, more preferably, equal to or greater than 30%, particularly preferably, equal to or greater than 50%, quite preferably, equal to or greater than 80%, and most preferably, 100%, i.e., the circumferential portion is continuous across the whole circumference. The circumferential portion may be intermittently continuous, and thus there may be a plurality of circumferential portion pieces. In this case, regarding the length of the circumferential portion piece among the plurality of circumferential portion pieces that forms the circumferential portion in the circumferential direction of the circumferential portion, it is preferable that there should be the circumferential portion piece that has a length which is equal to or greater than 10% of the length of the whole circumference of the stamp, more preferably, the circumferential portion piece that has a length which is equal to or greater than 20%, and particularly preferably, the circumferential portion piece that has a length which is equal to or greater than 30%. It is preferable that the total of the lengths of the plurality of circumferential portion pieces in the circumferential direction should be equal to or greater than 50% of the whole circumference of the stamp, more preferably, equal to or greater than 80%, and particularly preferably, equal to or greater than 90%.

It is preferable that the resin-made molding component should be not formed at the external edge of the substrate. Moreover, the resin-made molding component is a cured resin. Furthermore, the height of the side face of the resin-made molding component is formed so as to be equal to or higher than 1 µm. Still further, it is preferable that the difference between the maximum value of the height of the side wall relative to the surface provided with the pattern and the minimum value thereof should be equal to or smaller than 1 µm.

Since the stamp according to the present disclosure includes the circumferential portion, breakage and peeling of the resin-made component when the stamp is utilized and when such a component is carried or is subjected to handling can be suppressed. Moreover, when an intended circumferential portion is intermittently present on the stamp, the strength of the circumferential portion itself and adhesive force of the circumferential portion itself to the substrate decrease, possibly causing a micro-contamination. When the stamp is utilized to transfer the micro-component, even if the occurring contamination is microscale that cannot be viewed by eye, the adverse effect of such a contamination to the micro-component is unignorable. In contrast, according to the stamp of the present disclosure, since the circumferential portion that is continuous in the circumferential direction is proactively provided, the strength of the circumferential portion itself and the adhesive force to the substrate can be enhanced in comparison with a case in which there is an unintended and intermittent circumferential portion, and thus it is expected that an occasion of a contamination can be suppressed. Hence, it is quite useful to utilize the stamp of the present disclosure to the transfer of a micro-component.

Next, a transferring method according to the present disclosure will be described. The transferring method according to the present disclosure is to pick up the micro-component, such as a micro LED or a semiconductor chip, by the above-described stamp of the present disclosure, and to transfer the micro-component to a substrate. In this case, adhesion with the micro-component can be controlled by pressure between the convexities of the stamp and the micro-component, and speed when the micro-component is picked up. The transferring method according to the present disclosure is applicable to the production method of a Micro Electro Mechanical Systems (MEMS). More specifically, in the production method of a MEMS that includes a plurality of micro-components having the same or different functions and integrated on a single substrate, the micro-component picked up by the stamp according to the present disclosure may be transferred to the substrate.

REFERENCE SIGNS LIST

1 Mold
2 Substrate
3 Object subjected to pattern formation
4 Stage
5 Placing means
6 Pressure adjusting unit
7 Pressure adjusting means 8 Fixing means
9 Slide preventing means
11 Wall portion
15 Protrusion
61 Pressure adjusting chamber
62 Casing
71 Depressurizing means
72 Pressurizing means
81 Light emitting means

The invention claimed is:

1. An imprinting method of transferring a molding pattern of a mold to an object, the imprinting method comprising:
a depressurizing process of depressurizing by eliminating a gas from between the mold and the object in a pressure adjusting chamber;
a placing process of placing, in the depressurizing process, the mold and a substrate with the object being held between the mold and the substrate, and with either one of the mold and the substrate being placed on the object with a fluidity so as to be substantially floating;
a pressurizing process of pressurizing the mold against the object by positive gas pressure uniformly applied in the pressure adjusting chamber within a range that with either the mold or the substrate placed against a stage, the other of the mold and the substrate is placed on the object so as to be substantially floating on the object with the mold and substrate spaced from one another; and
a fixing process of fixing the object to the molding pattern.

2. The imprinting device method according to claim 1, further comprising detecting a relative position of the mold to the substrate.

3. The imprinting method according to claim 2, further comprising controlling at least one of a placing means for placing one of the mold or the substrate or a pressure adjusting means for pressurizing an interior of the pressure adjusting chamber based on detection information from a position detecting means for detecting the relative position of the mold to the substrate.

4. The imprinting method according to claim 1, wherein the pressurizing process is executed while slide movement between the mold and the substrate is prevented.

5. The imprinting method according to claim 1, wherein the placing process includes placing the mold and the substrate so as to be in parallel with each other.

6. The imprinting method according to claim 1, wherein the fixing process is a light emitting process of emitting light to the object for curing, thereby fixing the molding pattern to the object, or is a temperature adjusting process of adjusting a temperature of the object for curing, thereby fixing the molding pattern to the object.

7. The imprinting method according to claim 1, wherein the mold comprises a wall portion that surrounds a circumference of the molding pattern.

8. The imprinting method according to claim 7, wherein a height of the wall portion relative to a surface of the mold where the molding pattern is formed is equal to or higher than 1 µm.

9. The imprinting method according to claim 7, wherein a nonuniformity of a height of the wall portion, defined as a difference between a maximum value of the height of the wall portion relative to a surface of the mold where the molding pattern is formed and a minimum value of the height of the wall portion relative to the surface of the mold where the molding pattern is formed, is equal to or smaller than 1 µm.

10. A production method of a stamp that comprises a resin-made molding component formed on a substrate, the method comprising:
in a state of pressurizing a mold against a fluid resin sandwiched between the substrate and the mold with the mold including a molding pattern and a wall portion surrounding a circumference of the molding pattern, curing the fluid resin to transfer the molding pattern to the resin,
wherein the pressurizing is executed by positive gas pressure applied in a state that either the mold or the substrate is placed against a stage, and the other of the mold and the substrate is substantially floating on the fluid resin with the mold and substrate spaced from one another.

11. The production method of the stamp according to claim 10, wherein the pattern comprises convexities and concavities.

12. The production method of the stamp according to claim 11, wherein a minimum dimension of a width of the convexities is equal to or smaller than 100 µm.

13. The production method of the stamp according to claim 11, wherein a minimum dimension of a width of the concavities is equal to or smaller than 100 µm.

14. The production method of the stamp according to claim 11, wherein a depth of the concavities is equal to or greater than 10 nm.

15. The production method of the stamp according to claim 10, wherein the pressurizing is executed while slide movement between the mold and the substrate is prevented.

16. The production method of the stamp according to claim 10, wherein the fluid resin is a photo-curable resin or a thermosetting resin.

17. The production method of the stamp according to claim 10, wherein the wall portion shapes a side surface of the resin-made molding component.

18. The production method of the stamp according to claim 10, wherein a height of the wall portion relative to a surface of the mold where the molding pattern is formed is equal to or higher than 1 µm.

19. The production method of the stamp according to claim 10, wherein a nonuniformity of a height of the wall portion, defined as a difference between a maximum value of the height of the wall portion relative to a surface of the mold where the molding pattern is formed and a minimum value of the height of the wall portion relative to the surface of the mold where the molding pattern is formed, is equal to or smaller than 1 µm.

20. The production method of the stamp according to claim 10, wherein the resin-made molding component comprises:
a surface provided with a pattern that is transferred from the molding pattern;
a side face extending from the surface provided with the pattern to the substrate; and
a circumferential portion extending from the side face toward an external edge of the substrate.

21. The production method of the stamp according to claim 20, wherein the resin-made molding component is not formed at the external edge of the substrate.

22. The production method of the stamp according to claim 20, wherein a height of the side face is equal to or higher than 1 µm.

23. The production method of the stamp according to claim 20, wherein a difference between a maximum value of a height of the side face relative to the surface provided with the pattern and a minimum value of the height of the side surface relative to the surface provided with the pattern is equal to or smaller than 1 µm.

* * * * *